United States Patent
Lee

(10) Patent No.: US 6,707,731 B2
(45) Date of Patent: Mar. 16, 2004

(54) INTEGRATED CIRCUIT MEMORY DEVICES WITH PER-BIT REDUNDANCY AND METHODS OF OPERATION THEREOF

(75) Inventor: Jae-Goo Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/068,148

(22) Filed: Feb. 6, 2002

(65) Prior Publication Data
US 2002/0110029 A1 Aug. 15, 2002

(30) Foreign Application Priority Data

Feb. 14, 2001 (KR) .......................................... 2001-7276

(51) Int. Cl.⁷ ................................................ G11C 7/00
(52) U.S. Cl. ................................... 365/200; 365/230.03
(58) Field of Search ............................. 365/200, 230.03

(56) References Cited

U.S. PATENT DOCUMENTS

| | | | | |
|---|---|---|---|---|
| 5,293,348 A | * | 3/1994 | Abe ....................... | 365/230.03 |
| 5,596,536 A | * | 1/1997 | Koh ........................... | 365/200 |
| 6,067,260 A | * | 5/2000 | Ooishi et al. ............... | 365/200 |
| 6,249,474 B1 | * | 6/2001 | Arimoto ................ | 365/230.03 |

FOREIGN PATENT DOCUMENTS

| JP | Hei 11-185493 | 7/1999 |
|---|---|---|
| KR | 1999-12411 | 2/1999 |

OTHER PUBLICATIONS

Notice to Submit Response, Korean Application No. 10-2001-007276, Sep. 26, 2002.

* cited by examiner

Primary Examiner—Son Mai
(74) Attorney, Agent, or Firm—Myers Bigel Sibley & Sajovec

(57) ABSTRACT

An integrated circuit memory device includes a plurality of memory cells arranged as a plurality of blocks. Each of the blocks includes a plurality of primary memory cells that are coupled and decoupled to and from respective input/output lines responsive to a primary column select line and a plurality of redundant memory cells that are coupled and decoupled to and from respective ones of the input/output lines responsive to a redundant column select line. The device further includes a column select circuit, coupled to the primary column select lines and to the redundant column select lines, that drives a first primary column select line responsive to application of a first column address input and that drives a first redundant column select line in place of the first primary column select line responsive to application of a second column address input. The device also includes a plurality of sense amplifiers and an input/output control circuit configurable to selectively connect input/output lines to a sense amplifier such that a primary memory cell associated with the first primary column select line is coupled to the sense amplifier responsive to the first column address input and such that a redundant memory cell associated with the first redundant column select line is coupled to the sense amplifier responsive to the second column address input. Related operating methods are also discussed.

25 Claims, 4 Drawing Sheets

INTEGRATED CIRCUIT MEMORY DEVICES WITH PER-BIT REDUNDANCY AND METHODS OF OPERATION THEREOF

RELATED APPLICATION

This application claims the benefit of Korean Application No. 2001-7277, filed Feb. 14, 2001, the disclosure of which is hereby incorporated herein by reference.

BACKGROUND OF THE INVENTION

The present invention relates to integrated circuit memory devices, and more particularly, to integrated circuit memory devices with redundant cells and methods of operation thereof.

Integrated circuit memory devices commonly include spare memory cells, i.e., redundant memory cells, which are used to replace primary ("normal") memory cells that are defective. In some conventional memory devices, if at least one primary memory cell connected to a column select line CSL is defective in a column redundancy scheme, the column select line CSL is replaced with a spare column select line SCSL. In other words, all memory cells connected to the column select line CSL are replaced with spare memory cells connected to the spare column select line SCSL even if only one memory cell connected to the column select line is defective.

FIG. 1 shows a conventional one-to-one dedicated column redundancy scheme. Referring to FIG. 1, input/output blocks 11 and 13 each include a plurality of memory cells, column select lines CSL11, CSL12, CSL21, CSL 22 connected to the plurality of memory cells, and spare column select lines SCSL11, SCSL12, SCSL21, SCSL22. The column select lines CSL11, CSL12, CSL21, CSL22 are connected to primary memory cells for normal operation of the primary memory cells. The spare column select lines SCSL11, SCSL12, SCSL21, SCSL22, which are connected to spare memory cells, i.e., redundant memory cells, are for used to replace defective memory cells.

The input/output block 11 includes one local input/output line LIO1 and one global input/output line GIO1, and the input/output block 13 includes one local input/output line LIO2 and one global input/output line GIO2. The local input/output line LIO1 and the global input/output line GIO1 input and output data into memory cells in the input/output block 11, and the local input/output line LIO2 and the global input/output line GIO2 input and output data into memory cells in the input/output block 13.

In the one-to-one redundancy scheme shown in FIG. 1, if a column select line CSL11 in the input/output block 11 is defective, i.e., if at least one memory cell M1 connected to the column select line CSL11 is defective, the column select line CSL11 is replaced with a spare column select line SCSL11. If a column select line CSL21 in the input/output block 13 is defective, i.e., if at least one memory cell connected to the column select line CSL21 is defective, the column select line CSL21 is replaced with a spare select line SCSL21.

In the one-to-one column redundancy scheme shown in FIG. 1, defective column select lines in a predetermined input/output block are replaced with only spare column select lines in the same input/output block. This can result in poor repair efficiency and flexibility.

FIG. 2 shows a conventional dataline column redundancy scheme. Referring to FIG. 2, in the dataline column redundancy scheme, input/output blocks 21 and 23 do not include spare column select lines. A redundant input/output block 25 includes spare column select lines.

The input/output block 21 includes one local input/output line LIO1, and the input/output block 23 includes one local input/output line LIO2. The redundant input/output block 25 also includes one local input/output line LIO3. The input/output blocks 21 and 23 and the redundant input/output block 25 share a global input/output line GIO.

Data is input into and output from memory cells in the input/output block 21 via the local input/output line LIO1 and the shared input/output line GIO, and data is input into and output from memory cells in the input/output block 23 via the local input/output line LIO2 and the shared input/output line GIO. Data is input into and output from memory cells in the redundant input/output block 25 via the local input/output line LIO3 and the shared global input/output line GIO.

In the dataline column redundancy scheme shown in FIG. 2, if column select lines CSL11 and CSL12 in the input/output block 21 are defective, the column select lines CSL11 and CSL12 are replaced with spare column select lines SCSL1 and SCSL2 in the redundant input/output block 25. If column select lines CSL21, CSL22, and CSL 23 in the input/output block 23 are defective, the column select lines CSL21, CSL22, CSL23 are replaced with spare column select lines SCSL3, SCSL4, and SCSL5 in the redundant input/output block 25.

Accordingly, in the dataline column redundancy scheme shown in FIG. 2, defective column select lines in the input/output blocks are replaced with spare column select lines in the redundant input/output block. Therefore, repair efficiency and flexibility may be improved to some extent. However, the dataline column redundancy scheme uses a generally non-uniform structure than can increase the loads of data paths for redundant input/output blocks. This can reduce access speed. In addition, if two or more column select lines corresponding to the same column address in two or more input/output blocks are connected to defective cells, repair may be impossible.

SUMMARY OF THE INVENTION

According to some embodiments of the present invention, an integrated circuit memory device includes a plurality of memory cells arranged as a plurality of blocks. Each of the blocks includes a plurality of primary memory cells that are coupled and decoupled to and from respective input/output lines responsive to a primary column select line and a plurality of redundant memory cells that are coupled and decoupled to and from respective ones of the input/output lines responsive to a redundant column select line. The device further includes a column select circuit, coupled to the primary column select lines and to the redundant column select lines, that drives a first primary column select line responsive to application of a first column address input and that drives a first redundant column select line in place of the first primary column select line responsive to application of a second column address input. The device also includes a plurality of sense amplifiers, and an input/output control circuit configurable to selectively connect input/output lines to a sense amplifier such that a primary memory cell associated with the first primary column select line is coupled to the sense amplifier responsive to the first column address input and such that a redundant memory cell associated with the first redundant column select line is coupled to the sense amplifier responsive to the second column address input.

In further embodiments, respective pluralities of input/output lines are associated with respective ones of the blocks of memory cells, and the first primary memory cell and the first redundant memory cell are in the same block of memory cells. The input/output control circuit couples the first primary memory cell and the first redundant memory cell to a sense amplifier via the plurality of input/output lines associated with the same block of memory cells. In other embodiments, the first primary memory cell and the first redundant memory cell are in respective first and second blocks of memory cells, and the input/output control circuit couples the first primary memory cell and the first redundant memory cell to a sense amplifier via first and second input/output lines associated with respective ones of the first and second blocks of memory cells.

The input/output control circuit may comprise a plurality of switches that couple and decouple the input/output lines to and from the plurality of sense amplifiers and a switch control circuit that controls the plurality of switches. The switch control circuit may be fuse programmable. Related operating methods are also discussed.

DETAILED DESCRIPTION

The present invention now will be described more fully hereinafter with reference to the accompanying drawings, in which typical embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
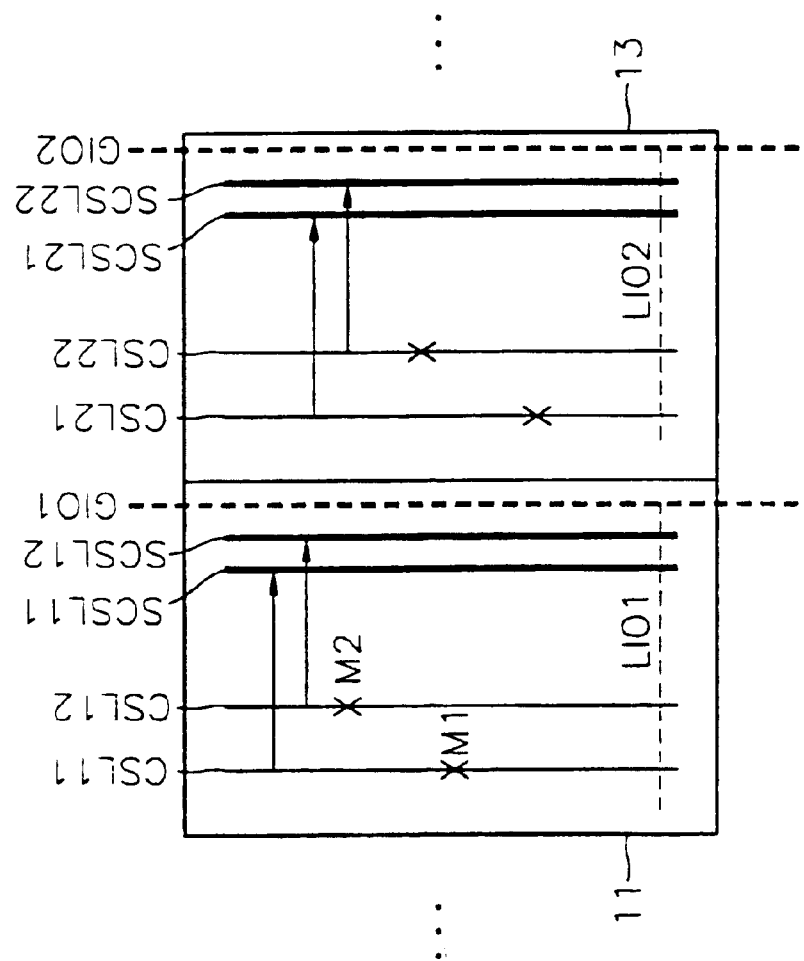
FIGS. 1 and 2 are schematic diagrams of conventional integrated circuit memory devices.
Figure 2:
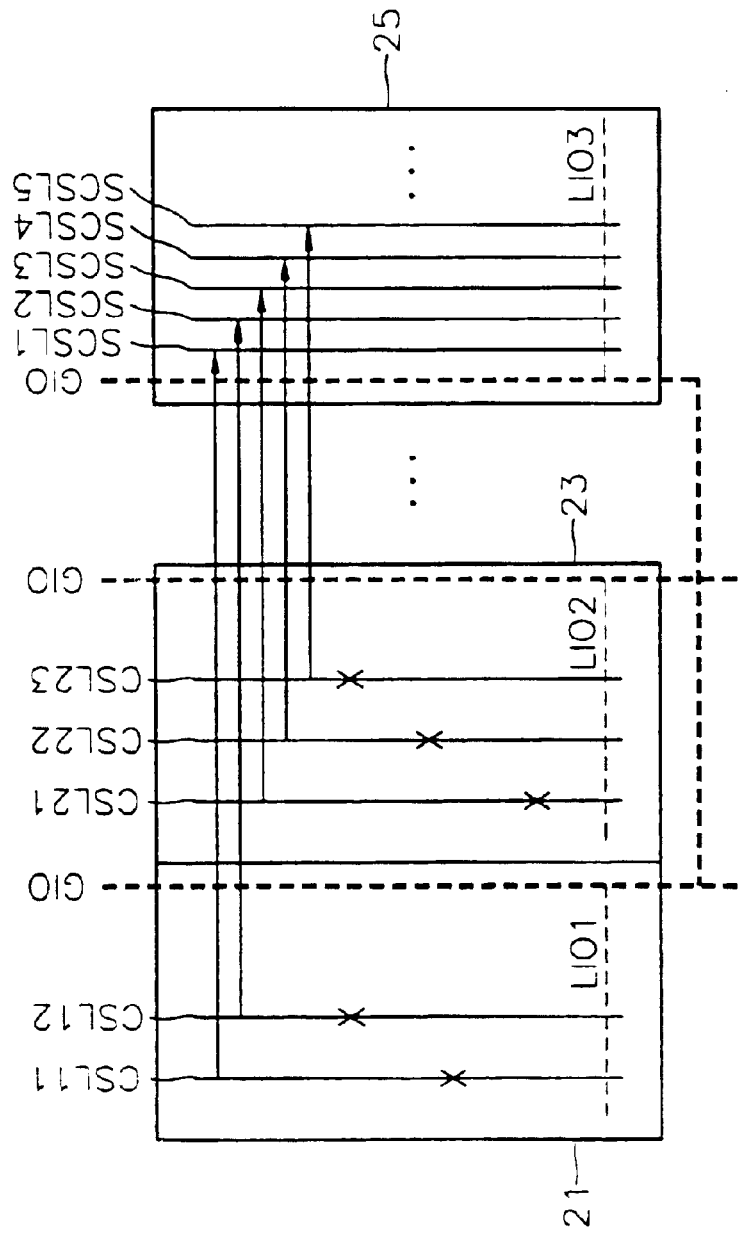
Figure 3:
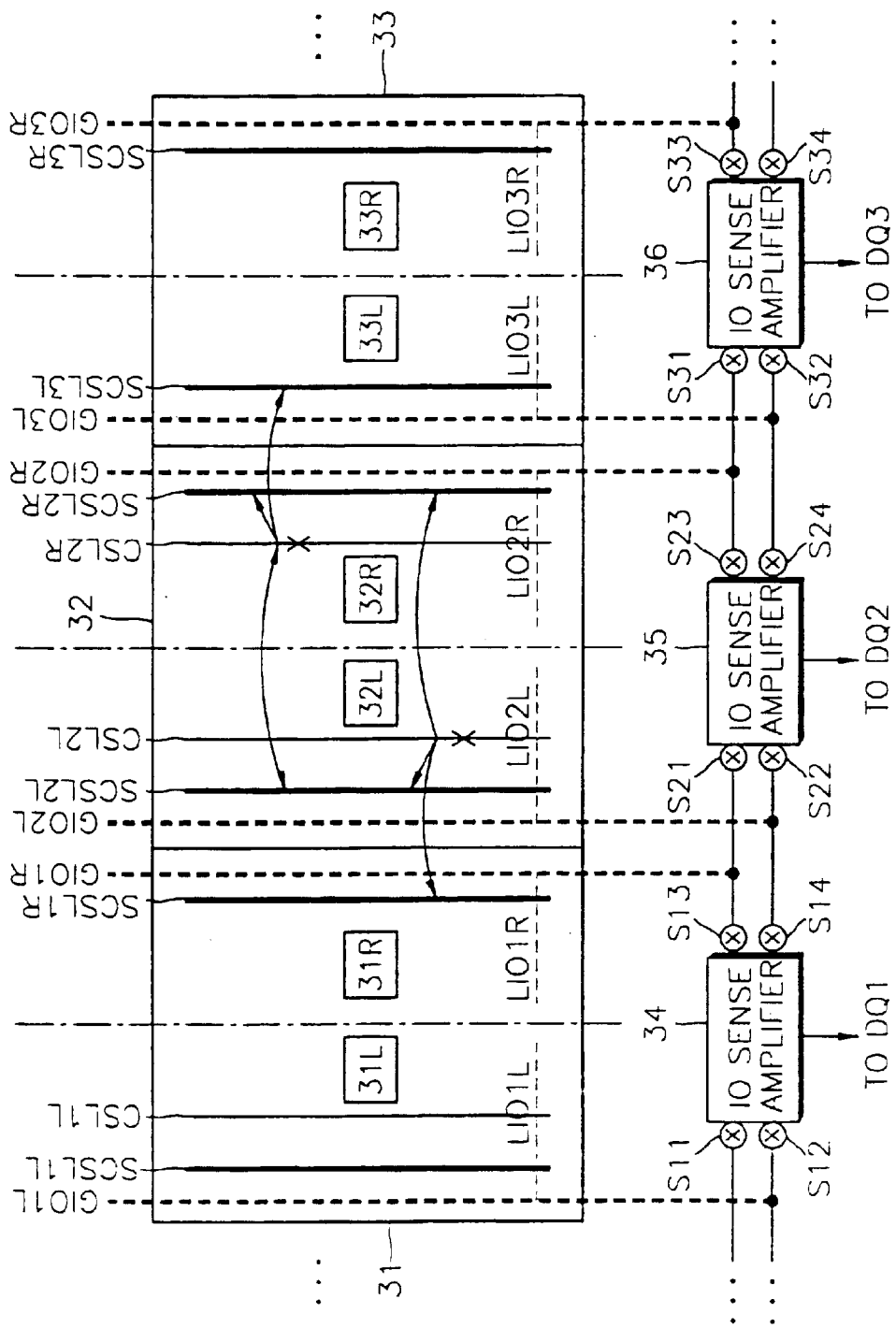
FIG. 3 is a schematic diagram of an integrated circuit memory device according to embodiments of the present invention.

Referring to FIG. 3, in an integrated circuit memory device according to embodiments of the present invention, input/output blocks 31, 32, and 33 are divided into first blocks 31L, 32L, and 33L and second blocks 31R, 32R, and 33R, respectively. The first blocks 31L, 32L, and 33L and the second blocks 31R, 32R, and 33R each include a plurality of memory cells, column select lines CSL1L, CSL2L, CSL2R connected to the plurality of memory cells, and spare column select lines SCSL1L, SCSL1R, SCSL2L, SCSL2R, SCSL3L, SCSL3R. The column select lines CSL1L, CSL2L, CSL2R are connected to primary memory cells for normal operation of the primary memory cells. The spare column select lines SCSL1L, SCSL1R, SCSL2L, SCSL2R, SCSL3L, SCSL3R are connected to spare memory cells, i.e., redundant memory cells.

The input/output block 31 includes a local input/output line LIO1L and a global input/output line GIO1L for the first block 31L, and a local input/output line LIO1R and a global input/output line GIO1R for the second block 31R. The input/output block 32 includes a local input/output line LIO2L and a global input/output line GIO2L for the first block 32L, and a local input/output line LIO2R and a global input/output line GIO2R for the second block 32R. The input/output block 33 includes a local input/output line LIO3L and a global input/output line GIO3L for the first block 33L, and a local input/output line LIO3R and a global input/output line GIO3R for the second block 33R.

In the input/output block 31, data is input into and output from memory cells in the first block 31L via the local input/output line LIO1L and the global input/output line GIO1L, and data is input into memory cells in the second block 31R via the local input/output line LIO1R and the global input/output line GIO1R. In the input/output block 32, data is input into and output from memory cells in the first block 32L via the local input/output line LIO2L and the global input/output line GIO2L, and data is input into memory cells in the second block 32R via the local input/output line LIO2R and the global input/output line GIO2R. In the input/output block 33, data is input into and output from memory cells in the first block 33L via the local input/output line LIO3L and the global input/output line GIO3L, and data is input into memory cells in the second block 33R via the local input/output line LIO3R and the global input/output line GIO3R.

If a memory cell associated with the column select line CSL2L in the first block 32L of the input/output block 32 is defective, the column select line CSL2L may be replaced with the spare column select line SCSL2L in the first block 32L of the input/output block 32, the spare column select line SCSL2R in the second block 32R of the input/output block 32, or the spare column select line SCSL1R in the second block 31R of the input/output block 31 adjacent to the input/output block 32 when accessing the address corresponding to the defective cell. If a memory cell associated with the column select line CSL2R in the second block 32R of the input/output 32 is defective, the column select line CSL2R may be replaced with the spare column select line SCSL2L in the first block 32L of the input/output block 32, the spare column select line SCSL2R in the second block 32R of the input/output block 32, or the spare column select line SCSL3L in the first block 33L of the input/output block 33 adjacent to the input/output block 32 when accessing the address corresponding to the defective cell. If the input/output blocks 31 and 33 have defective cells, column select lines may be replaced with spare column select lines in the above-described way.

For example, if the defective column select line CSL2L in the first block 32L of the input/output block 32 is replaced with the spare column select line SCSL1R in the second block 31R of the input/output block 31 adjacent to the input/output block 32, for one column address input, the column select line CSL1L used for normal access and the spare column select line SCSL1R used for repair are simultaneously activated in the input/output block 31. Alternatively, if the defective column select line CSL2R in the second block 32R of the input/output block 32 is replaced with the spare column select line SCSL3L in the first block 33L of the input/output block 33 also adjacent to the input/output block 32, a column select line (not shown) used for normal access by one column address and a spare column select line SCSL3L used for repair are simultaneously activated in the input/output block 33.

An integrated circuit memory device according to embodiments of the present invention further includes an input/output control circuit including switches S11, S12, S13, S14, S21, S22, S23, S24, S31, S32, S33, S34, a control signal generating circuit 41 (shown in FIG. 4) that generates signals that control the switches S11, S12, S13, S14, S21, S22, S23, S24, S31, S32, S33, S34 and input/output sense amplifiers 34, 35, and 36. The input/output sense amplifiers 34, 35, and 36 are connected to input/output pins DQ1, DQ2, and DQ3.

The input/output control circuit controls the connection between global input/output lines GIO1L, GIO1R, GIO2L, GIO2R, GIO3L, GIO3R and the input/output sense amplifiers 34, 35, and 36. For example, if a column select line CSL2L in the first block 32L of the input/output block 32 is replaced with the spare column select line SCSL1R in the second block 31R of the input/output block 31, the switch S21 may be turned on to connect the global input/output line GIO1R in the input/output block 31 to the input/output sense amplifier 35. Alternatively, if the column select line CSL2L is replaced with the spare column select line SCSL2L in the first block 32L, the switch S22 may be turned on to connect the global input/output line GIO2L in the input/output block 32 to the input/output sense amplifier 35. In another alternative configuration, if the column select line CSL2L in the first block 32L of the input/output block 32 is replaced with the spare column select line SCSL2R in the first block 32R, the switch S23 may be turned on to connect the global input/output line GIO2R in the input/output block 32 to the input/output sense amplifier 35.

Figure 4:
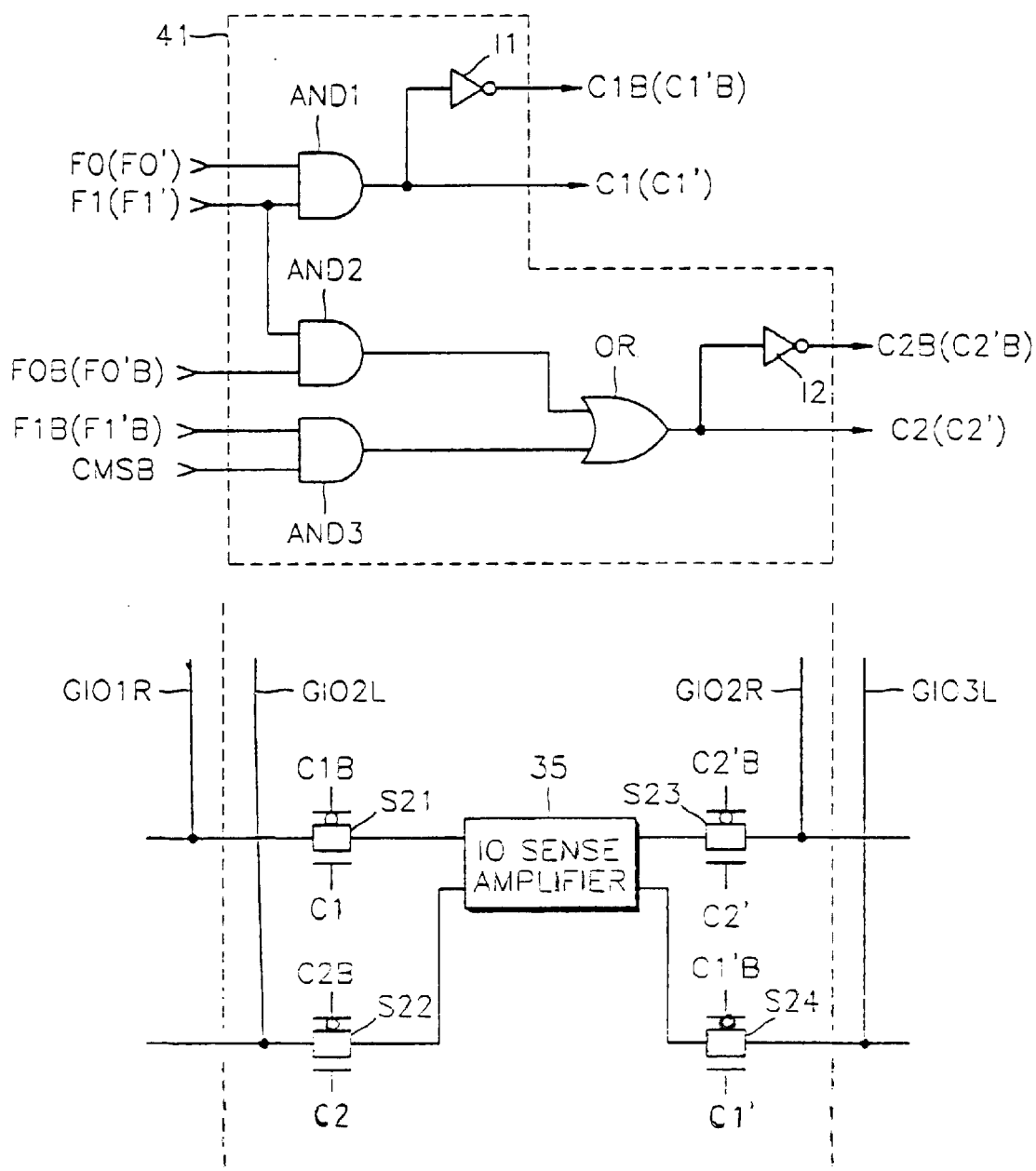
FIG. 4 is a schematic diagram of an input/output control circuit according to further embodiments of the present invention.

FIG. 4 illustrates a portion of the input/output control circuit. Referring to FIG. 4, the input/output control circuit includes switches S21, S22, S23, S24 and a control signal generating circuit 41 that generates complementary pairs of switch control signals C1, C1B, C2, C2B, C1', C1'B, C2', C2'B. The switch S21 connects the global input/output line GIO1R in the input/output block 31 to the input/output sense amplifier 35 in response to the activation of a first switch control signal C1. The switch S22 connects the global input/output line GIO2L in the input/output block 32 to the input/output sense amplifier 35 in response to the activation of a second switch control signal C2. The switch 24 connects the global input/output line GIO3L in the input/output block 33 to the input/output sense amplifier 35 in response to the activation of another first switch control signal C1'. The switch 23 connects the global input/output line GIO2R in the input/output block 32 to the input/output sense amplifier 35 in response to the activation of another second switch control signal C2'.

The control signal generating circuit 41 includes AND gates AND1, AND2, and AND3, an OR gate, and inverters I1 and I2. F0 (or F0') is a signal representing the position of an input/output block having column select lines associated with defective cells, and F1 (or F1') is a signal representing whether or not an applied column address corresponds to a column select line associated with a defective cell. F0, F0', F1 and F1' may be generated, for example, by programming fuses in a fuse block (not shown). CMSB represents the most significant bit of the column address, the value of which corresponds to positions of first and second blocks in an input/output block.

In more detail, F0 (F0') is logic "low" if a defective memory cell exists in a given input/output block and logic "high" if a defective cell is in an input/output block adjacent to the given input/output block. F1 (F1') is logic "high" if a column address corresponds to a defective column select line; otherwise, it is a logic "low." CMSB is a logic "high" if the address corresponds to a first block of an input/output block and a logic "low" if the address corresponds to a second block in the input/output block.

If a defective cell is connected to the column select line CSL2L in the first block 32L of the input/output block 32 shown in FIG. 3, but the applied column address addresses the first block 32L but does not correspond to the defective cell, F0 is logic "low", F1 is logic "low", and CMSB is logic "high". Thus, the first switch control signal C1 is logic "low", and the inverse first switch control signal C1B is logic "high". The second switch control signal C2 is logic "high", and the inverse second switch control signal C2B is logic "low". Accordingly, switch S22 is turned on, and switch S21 is turned off, such that the global input/output line GIO2L in the input/output block 32 is connected to the input/output sense amplifier 35.

If a defective cell is connected to the column select line CSL2L in the first block 32L of the input/output block 32, the column select line CSL2L is to be replaced with the spare column select line SCSL2L in the first block 32L of the input/output block 32, and the applied column address corresponds to the defective cell, F0 is logic "low", F1 is logic "high", and CMSB is logic "high." The first switch control signal C1 is logic "low," and the inverse first switch control signal C1B is logic "high." The second switch control signal C2 is logic "high", and the inverse second switch control signal C2B is logic "low." Accordingly, as in the first case, switch S22 is turned on, and switch S21 is turned off, such that the global input/output line GIO2L in the input/output block 32 is connected to the input/output sense amplifier 35. In this case, the input/output sense amplifier 35 accesses memory cells connected to the spare column select line SCSL2L in the first block 32L of the input/output block 32.

F0 is logic "high", F1 is logic "high", and CMSB is logic "high" if a defective cell is coupled to the column select line CSL2L in the first block 32L of the input/output block 32, the column select line CSL2L is to be replaced with a spare column select line SCSL1R in the second block 31R of the input/output block 31, and the applied column address corresponds to the defective cell. Thus, the first switch control signal C1 is logic "high," the inverse first switch control signal C1B is logic "low," the second switch control signal C2 is logic "low", and the inverse second switch control signal C2B is logic "high". Accordingly, switch S22 is turned on and switch S21 is turned off, such that the global input/output line GIO1R in the adjacent input/output block 31 is connected to the input/output sense amplifier 35. In this case, the input/output sense amplifier 35 accesses memory cells connected to the spare column select line SCSL1R in the second block 31R of the input/output block 31 via the global input/output line GIO1R.

F0' is logic "low", F1' is logic "high", and CMSB is logic "high" if a defective cell is coupled to the column select line CSL2L in the first block 32L of the input/output block 32, if the column select line CSL2L is to be replaced with the spare column select line SCSL2R in the second block 32R of its input/output block 32, and if the applied column address corresponds to the defect cell. The first switch control signal C1 is logic "low", and the inverse first switch control signal C1'B is logic "high." The second switch control signal is C2' is logic "high", and the inverse second switch control signal C2'B is logic "low." Accordingly, switch S23 is turned on and switch S24 is turned off, such that the global input/output line GIO2R in the input/output block 32 is connected to the input/output sense amplifier 35. In this case, the input/output sense amplifier 35 accesses memory cells connected to the spare column select line SCSL2R in the second block 32R of the input/output block 32 via the global input/output line GIO2R.

As described above, in the integrated circuit memory device according to the present invention, the defective column select line in a given input/output block may be replaced with a spare column select line in an adjacent input/output block or by a spare column select line in the same input/output block. Thus, repair efficiency and flexibility can be increased. Also, the structure may be made more uniform and the length of local input/output lines may be reduced to reduce loading. As a result, data access speed can be maintained at a desirable level.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a plurality of memory cells arranged as a plurality of blocks, each of the blocks including a plurality of primary memory cells that are coupled and decoupled to and from respective input/output lines responsive to a primary column select line and a plurality of redundant memory cells that are coupled and decoupled to and from respective ones of the input/output lines responsive to a redundant column select line;
   a column select circuit, coupled to the primary column select lines and to the redundant column select lines, that drives a first primary column select line responsive to application of a first column address input and that drives a first redundant column select line in place of the first primary column select line responsive to application of a second column address input;
   a plurality of sense amplifiers; and
   an input/output control circuit configurable to selectively connect input/output lines to a sense amplifier such that a primary memory cell associated with the first primary column select line is coupled to the sense amplifier responsive to the first column address input and such that a redundant memory cell associated with the first redundant column select line is coupled to the sense amplifier responsive to the second column address input.

2. The device of claim 1, wherein respective pluralities of input/output lines are associated with respective ones of the blocks of memory cells, wherein the first primary memory cell and the first redundant memory cell are in the same block of memory cells, and wherein the input/output control circuit couples the first primary memory cell and the first redundant memory cell to a sense amplifier via the plurality of input/output lines associated with the same block of memory cells.

3. The device of claim 1, wherein respective pluralities of input/output lines are associated with respective ones of the blocks of memory cells, wherein the first primary memory cell and the first redundant memory cell are in respective first and second blocks of memory cells, and wherein the input/output control circuit couples the first primary memory cell and the first redundant memory cell to a sense amplifier via first and second input/output lines associated with respective ones of the first and second blocks of memory cells.

4. The memory device of claim 1, wherein the input/output control circuit comprises:
   a plurality of switches that couple and decouple the input/output lines to and from the plurality of sense amplifiers; and
   a switch control circuit that controls the plurality of switches.

5. The memory device of claim 4, wherein the switch control circuit is fuse programmable.

6. An integrated circuit memory device comprising:
   a plurality of input/output blocks being divided into first and second blocks and having a first local input/output line and a first global input/output line for the first block, and a second local input/output line and a second global input/output line for the second block,
   wherein data is input into and output from memory cells in the first block via the first local input/output line and the first global input/output line and data is input into and output from memory cells in the second block via the second local input/output line and the second global input/output line,
   wherein the first and second blocks each comprise column select lines for normal operation of primary memory cells and spare column select lines for replacing defective memory cells, and
   wherein a defective column select line in a first block of a predetermined input/output block is replaced with any one of a spare column select line in the first block of the predetermined input/output block, a spare column select line in a second block of the predetermined input/output block, and a spare column select line in a second block in an input/output block adjacent to the predetermined input/output block.

7. The integrated circuit memory device of claim 6, wherein a defective column select line in the second block of the predetermined input/output block is replaced with any one of a spare column select line in the first block of the predetermined input/output block, a spare column select line in the second block of the predetermined input/output block, and a spare column select line in a first block in another input/output block adjacent to the predetermined input/output block.

8. The integrated circuit memory device of claim 6, wherein one of the column select lines and one of the spare column select lines are simultaneously activated by one column address in the adjacent input/output block if the defective column select line in the first block of the predetermined input/output block is replaced with a spare column select line in a second block of the adjacent input/output block.

9. The integrated circuit memory device of claim 7, wherein one of the column select lines and one of the spare column select lines are simultaneously activated by one column address in the another adjacent input-output block if the defective column select line in the second block of the predetermined input/output block is replaced with a spare column select line in the first block of the another adjacent input/output block.

10. The integrated circuit memory device of claim 6, further comprising:
    a plurality of input/output sense amplifiers for each of the input/output blocks; and
    a input/output control circuit connecting a second global input/output line in the adjacent input/output block to the input/output sense amplifier for the predetermined input/output block if the defective column select line in the first block of the predetermined input/output block is replaced with the spare column select line in the second block of the adjacent input/output block.

11. The integrated circuit memory device of claim 10, wherein the input/output control circuit connects a first global input/output line of the predetermined input/output block to the input/output sense amplifier for the predetermined input/output block if the defective column select line in the first block of the predetermined input/output block is replaced with the spare column select line in the first block of the predetermined input/output block.

12. The integrated circuit memory device of claim 11, wherein the input/output control circuit connects the second global input/output line of the predetermined input/output block to the input/output sense amplifier for the predetermined input/output block if the defective column select line in the first block of the predetermined input/output block is replaced with the spare column select line in the second block of the predetermined input/output block.

13. The integrated circuit memory device of claim 12, wherein the input/output control circuit comprises:
   a first switch for connecting the second global input/output line of the adjacent input/output block to the input/output sense amplifier for the predetermined input/output block in response to the activation of a first control signal;
   a second switch for connecting the first global input/output line of the predetermined input/output block to the input/output sense amplifier for the predetermined input/output block in response to the activation of a second control signal;
   a third switch for connecting the second global input/output line of the predetermined input/output block to the input/output sense amplifier for the predetermined input/output block in response to the activation of a third control signal; and
   a control signal generator for generating the first, second, and third control signals,
   wherein the first control signal is activated when the defective column select line in the first block of the predetermined input/output block is replaced with the spare column select line in the second block of the adjacent input/output block, the second control signal is activated when the defective column select line in the first block of the predetermined input/output block is replaced with the spare column select line in the first block of the predetermined input/output block, and the third control signal is activated when defective column select line in the first block of the predetermined input/output block is replaced with the spare column select line in the second block of the predetermined input/output block.

14. A integrated circuit memory device comprising:
   a plurality of input/output blocks divided into first and second blocks, each having a plurality of memory cells, column select lines for normal operation of primary memory cells, and spare column select lines for replacing defective memory cells and each including a first local input/output line and a first global input/output line for the first block, and a second local input/output line and a second global input/output line for the second block,
   wherein a defective column select line in a first block of a predetermined input/output block is replaced with any one of a spare column select line in the first block of the predetermined input/output block, a spare column select line in a second block of the predetermined input/output block, and a spare column select line in a second block of an input/output block adjacent to the predetermined input/output block.

15. The integrated circuit memory device of claim 14, wherein a defective column select line in a second block of the predetermined input/output block is replaced with any one of a spare column select line in the first block of the predetermined input/output block, a spare column select line in the second block of the predetermined input/output block, and a spare column select line in a first block of another input/output block adjacent to the predetermined input/output block.

16. The integrated circuit memory device of claim 14, wherein one of the column select lines and one of the spare column select lines are simultaneously activated by one column address in an adjacent input/output block if the defective column select line in the first block of the predetermined input/output block is replaced with the spare column select line in the second block of the adjacent input/output block.

17. The integrated circuit memory device of claim 15, wherein one of the column select lines and one of the spare column select lines are simultaneously activated by one column address in the adjacent input/output block if the defective column select line in the second block of the predetermined input/output block is replaced with the spare column select line in the first block of the adjacent input/output block.

18. The integrated circuit memory device of claim 14, further comprising:
   a plurality of input/output sense amplifiers for each of the input/output blocks; and
   an input/output control circuit for connecting a second global input/output line of an adjacent input/output to an input/output sense amplifier for the predetermined input/output block if the defective column select line in the first block of the predetermined input/output block is replaced with the spare column select line in the second block of the adjacent input/output block.

19. The integrated circuit memory device of claim 18, wherein the input/output control circuit connects a first global input/output line of the predetermined input/output block to the input/output sense amplifier for the predetermined input/output block if the defective column select line in the first block of the predetermined input/output block is replaced with the spare column select line in the first block of the predetermined input/output block.

20. The integrated circuit memory device of claim 19, wherein the input/output control circuit connects the second global input/output line of the predetermined input/output block to the input/output sense amplifier for the predetermined input/output block if the defective column select line in the first block of the predetermined input/output block is replaced with the spare column select line in the second block of the predetermined input/output block.

21. The integrated circuit memory device of claim 20, wherein the input/output control circuit comprises:
   a first switch for connecting the second global input/output line of the adjacent input/output block to the input/output sense amplifier for the predetermined input/output block in response to the activation of a first control signal;
   a second switch for connecting the first global input/output line of the predetermined input/output block to the input/output sense amplifier for the predetermined input/output block in response to the activation of a second control signal;
   a third switch for connecting the second global input/output line of the predetermined input/output block to the input/output sense amplifier for the predetermined input/output block in response to the activation of a third control signal; and a control signal generator for generating the first, second, and third control signals, wherein the first control signal is activated when the defective column select line in the first block of the predetermined input/output block is replaced with the spare column select line in the second block of the adjacent input/output block, the second control signal is activated when the defective column select line in the first block of the predetermined input/output block is replaced with the spare column select line in the first block of the predetermined input/output block, and the third control signal is activated when the defective column select line in the first block of the predetermined input/output block is replaced with the spare column select line in the second block of the predetermined input/output block.

22. A method of operating a memory device that includes a plurality of memory cells arranged as a plurality of blocks, each of the blocks including a plurality of primary memory cells that are coupled and decoupled to and from respective input/output lines responsive to a primary column select line and a plurality of redundant memory cells that are coupled and decoupled to and from respective ones of the input/output lines responsive to a redundant column select line, the method comprising:

driving a first primary column select line responsive to application of a first column address input;

driving a first redundant column select line in place of the first primary column select line responsive to application of a second column address input; and selectively connecting input/output lines to a sense amplifier such that a primary memory cell associated with the first primary column select line is coupled to the sense amplifier responsive to the first column address input and such that a redundant memory cell associated with the first redundant column select line is coupled to the sense amplifier responsive to the second column address input.

23. The method of claim 22, wherein respective pluralities of input/output lines are associated with respective ones of the blocks of memory cells, wherein the first primary memory cell and the first redundant memory cell are in the same block of memory cells, and wherein selectively connecting input/output lines to a sense amplifier comprises coupling the first primary memory cell and the first redundant memory cell to the sense amplifier via the plurality of input/output lines associated with the same block of memory cells.

24. The method of claim 22, wherein respective pluralities of input/output lines are associated with respective ones of the blocks of memory cells, wherein the first primary memory cell and the first redundant memory cell are in respective first and second blocks of memory cells, and wherein selectively connecting input/output lines to a sense amplifier comprises coupling the first primary memory cell and the first redundant memory cell to a sense amplifier via first and second input/output lines associated with respective ones of the first and second blocks of memory cells.

25. The method of claim 22, wherein selectively connecting input/output lines to a sense amplifier comprises operating a plurality of switches that couple and decouple the input/output lines to and from the plurality of sense amplifiers, and wherein selectively connecting input/output lines to a sense amplifier is preceded by programming a switch control circuit to operate the plurality of switches such that a primary memory cell associated with the first primary column select line is coupled to the sense amplifier responsive to the first column address input and such that a redundant memory cell associated with the first redundant column select line is coupled to the sense amplifier responsive to the second column address input.

* * * * *